(12) United States Patent
Hsieh et al.

(10) Patent No.: US 8,833,966 B2
(45) Date of Patent: Sep. 16, 2014

(54) LIGHT DEVICE AND ITS LIGHT EMITTING DIODE MODULE

(75) Inventors: Ming-Zhe Hsieh, Miaoli County (TW); An-Yu Hsieh, Hsinchu (TW); Ming-Sung Tsai, Taipei (TW)

(73) Assignee: Edison Opto Corporation, New Taipei (TW)

( * ) Notice: Subject to any disclaimer, the term of this patent is extended or adjusted under 35 U.S.C. 154(b) by 168 days.

(21) Appl. No.: 13/619,782

(22) Filed: Sep. 14, 2012

(65) Prior Publication Data

US 2013/0258653 A1 Oct. 3, 2013

(30) Foreign Application Priority Data

Mar. 28, 2012 (TW) .............................. 101110847 A

(51) Int. Cl.
*F21V 9/16* (2006.01)
*H01L 25/075* (2006.01)

(52) U.S. Cl.
CPC ................................. *H01L 25/0753* (2013.01)
USPC .............................. 362/231; 362/294; 362/84

(58) Field of Classification Search
CPC ................................................. H01L 25/0753
USPC .............. 362/294, 235, 311.02, 311.04, 230, 362/231, 260, 373, 84; 257/88, 89, 79, 102, 257/100; 313/484–487, 489, 498, 512, 467, 313/468, 499, 501–503
See application file for complete search history.

(56) References Cited

U.S. PATENT DOCUMENTS

| | | | |
|---|---|---|---|
| 2011/0222264 A1* | 9/2011 | Matsuda et al. | 362/84 |
| 2012/0097997 A1* | 4/2012 | Chung et al. | 257/89 |
| 2012/0155076 A1* | 6/2012 | Li et al. | 362/231 |
| 2012/0187865 A1* | 7/2012 | Chung et al. | 315/294 |
| 2013/0076239 A1* | 3/2013 | Chung et al. | 315/76 |

* cited by examiner

*Primary Examiner* — Elmito Breval
(74) *Attorney, Agent, or Firm* — Dugan & Dugan, PC

(57) ABSTRACT

A light device and its light emitting diode module are provided in the disclosure. The light emitting diode module includes a substrate, an arrayed light emitting group and a single sealant body. The arrayed light emitting group includes a plurality of light emitting strings connected between a positive pole and a negative pole in parallel. Each light emitting strings includes a plurality of blue light emitting diode chips and a red light emitting diode chips, which are both electrically connected on the substrate in series. The single sealant body completely covers all of the light emitting strings, and is contained with phosphors uniformly therein.

19 Claims, 14 Drawing Sheets

LIGHT DEVICE AND ITS LIGHT EMITTING DIODE MODULE

RELATED APPLICATIONS

This application claims priority to Taiwan Application Serial Number 101110847, filed Mar. 28, 2012, which is herein incorporated by reference.

BACKGROUND

1. Technical Field Disclosure

The present disclosure relates to a light device with light emitting diodes. More particularly, the present disclosure relates to a light device with red and blue light emitting diodes.

2. Description of Related Art

As one of the important light devices, white light emitting diodes (LEDs) are gradually applied in a wide variety of lighting equipments and the back light sources of the liquid crystal displays (LCDs) because of the advantages such as power saving, low driven voltages, long life time, and being environment-friendly. A white light with high color rendering index (CRI) is always a main goal of developing the semi-conductor light sources.

There are some familiar methods to produce white light emitting diodes in the prior art. The first method uses different color diode chips with multiple wavelengths, e.g., red, blue and green chips, as light sources to make white light. However, there are some problems such as reaching only CRI of 80, and the non-uniformity mixed light for the light sources. Secondly, monochromatic blue light emitting element incorporated with yellow phosphor materials is applied for generating the white light. Although the white light therefore generated has high illumination efficiency, the low CRI and limited color saturation lead to the low efficiency in color mixture. In addition, it is observed that the chromaticity overly shifts in the chart under high electrical current. The third method uses phosphors excited by ultra-violet (UV) light to generate the white light. Since there still are unsolved deteriorating problems of applying the UV light in LED, it is hard to precisely control the illumination efficiency and luminescence characteristics. The problem of low illumination efficiency for the UV light emitting LEDs needs to improve the quality of epitaxy.

As a result, there are still some inconveniences and disadvantages in the real operations of the foregoing familiar production methods of the white light emitting diodes.

SUMMARY

An aspect of the disclosure provides a light device and its light emitting diode module to improve the inconvenience and the disadvantages mentioned above. As such, the light emitting diode (LED) module with high illumination efficiency and high color rendering index (CRI) are achieved so as to improve the total illumination quality.

The disclosure provides a light device and a light emitting diode module for mixing the light uniformly. It provides a larger color temperature range of the white light quality.

The disclosure provides a light emitting diode module. The light emitting diode module comprises a substrate, an arrayed light emitting group, and a single sealant body. The substrate comprises a positive pole and a negative pole. The arrayed light emitting group comprises a plurality of light emitting strings electrically connected to the positive pole and the negative pole in parallel. Each one of the light emitting strings comprises N number of blue light emitting diode chips and M number of red light emitting diode chips, wherein N number and M number are positive integers, and M>N≥1. The blue light emitting diode chips emit blue lights with the luminescence wavelength range from 445 to 460 nm, and the red light emitting diode chips emit red lights with the luminescence wavelength range from 600 to 630 nm. The red light emitting diode chips and the blue light emitting diode chips are deposed on the substrate in series, and the red light emitting diode chips are in an interlaced arrangement between the blue light emitting diode chips. The single sealant body, which comprises a plurality of phosphors with a luminescence wavelength range from 520 to 570 nm dispersed uniformly therein, covers all of the light emitting strings. The phosphors in the single sealant body are excited by a part of the blue light and then generate a yellow green light. Therefore, a white light with a color temperature range from 10000K to 2500K is mixed by the yellow green light, the other part of the blue light and the red light.

In one of the embodiments in the disclosure, the red light emitting diode chips and the blue light emitting diode chips in each one of the light emitting strings are arranged under the condition that the number of the red light emitting diode chips: the number of the blue light diode chips is chosen from 1:2 to 1:11. The ratio of the number of red light emitting diode chips to blue light emitting diode chips in each one of the light emitting strings remains the same. In addition, one of the light emitting strings is arranged in linearly or non-linearly.

In one of the embodiments in the disclosure, a plurality of phosphors with luminescence wavelength range from 600 to 630 nm are dispersed uniformly in the single sealant body, or, a plurality of phosphors with luminescence wavelength range from 585 to 630 nm are further dispersed uniformly in it.

In one of the embodiment in the disclosure, there is a certain distance between each blue light emitting diode chips and each red light emitting diode chips.

In summary, the disclosure provides solutions to solve the non-uniform mixed light situation under using the light emitting diodes. The luminous flux in unit area may be extracted a maximum by using the light device and the light emitting diode module in the disclosure. In addition, the light emitting diode module with high efficiency and high color rendering index may be achieved by using the combination of the specific phosphors and the light emitting diodes with certain luminous flux ratios.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
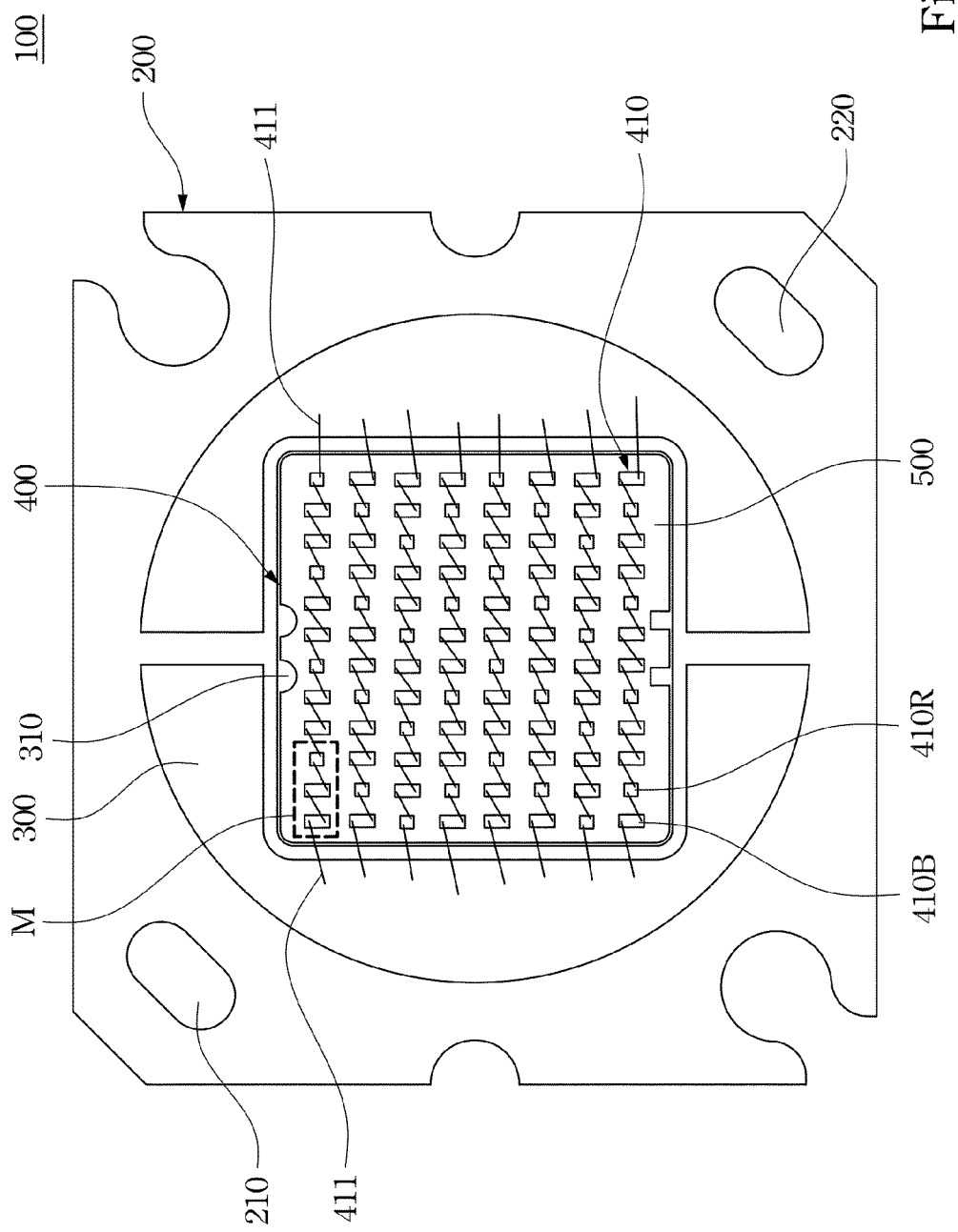
FIG. 1 is a top view of a light emitting diode module in one embodiment in the disclosure.

Reference will now be made in detail to the present embodiments in the disclosure, examples of which are illustrated in the accompanying drawings. Wherever possible, the same reference numbers are used in the drawings and the description to refer to the same or like parts.

Figure 2:
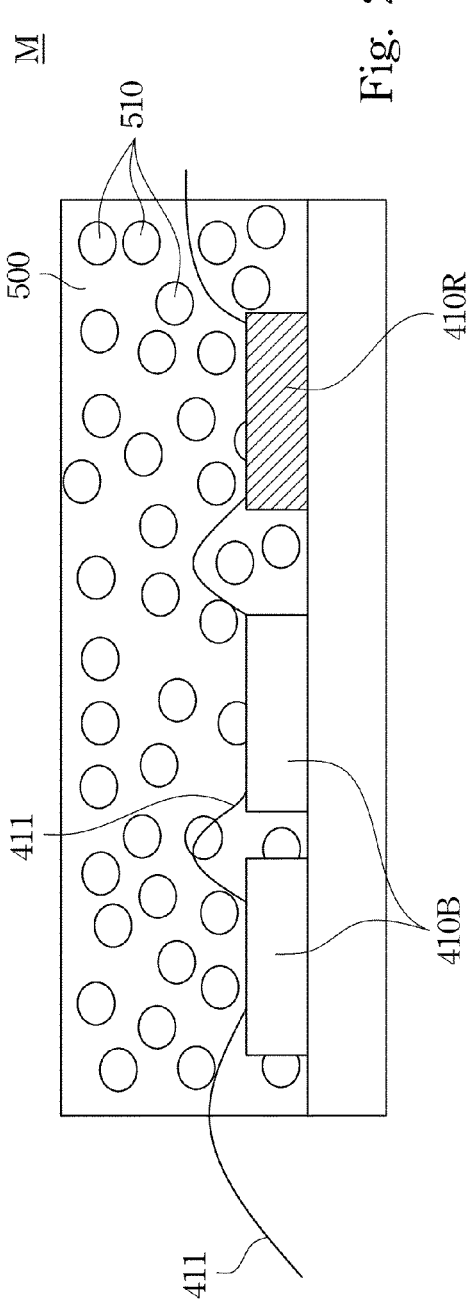
FIG. 2 is a partial side view of area M in FIG. 1.

FIG. 1 is a top view diagram of a light emitting diode module 100 in one embodiment in the disclosure while FIG. 2 is a partial side view of the area M in FIG. 1.

The light emitting diode module 100 in the disclosure comprises a substrate 200, a plastic wall 300, an arrayed light emitting group 400, and a single sealant body 500.

The substrate 200, a metal COB substrate 200 for providing the chip sealed directly for example, comprises a positive pole 210 and a negative pole 220. The plastic wall 300, a silicon gel for example, is fixed on the substrate 200 and forms a space 310. The arrayed light emitting group 400 is located in the space 310 and electrically connected to the substrate 200.

The arrayed light emitting group 400 comprises one or a plurality of light emitting strings 410. One terminal of each one of the light emitting strings 410 electrically connects to the positive pole 210, and the other terminal electrically connects to the negative pole 220. In addition, the light emitting strings 410 are electrically connected between the positive pole 210 and negative pole 220 in parallel.

Each light emitting strings 410 comprises a plurality of blue light emitting diode chips 410B and one or a plurality of red light emitting diode chips 410R. The red light emitting diode chips 410R and the blue light emitting diode chips 410B are arranged linearly and they are disposed on the substrate 200 in series via the conducting wire 411.

The red light emitting diode chips 410R are in an interlaced arrangement between the blue light emitting diode chips 410B in the light emitting strings 410. The blue light emitting diode chips 410B emit light with luminescence wavelength range from 445 to 460 nm, and the red light emitting diode chips 410R emit light with luminescence wavelength range from 600 to 630 nm. The number of the red light emitting diode chips 410R in each light emitting string 410 is larger than or equal to 1, and the number is always smaller than the number of the blue light emitting diode chips 410B.

The single sealant body 500 is formed on the whole arrayed light emitting group 400 with a single production. The single sealant body 500 covers the whole light emitting strings 410 completely. Therefore, the light emitting diode module 100 is identified to be a single light emitting module 100.

In addition, the single sealant body 500 at least comprises phosphors 510, such as YAG, TAG, BOSE, or Silicate. The phosphors are dispersed uniformly and its luminescence wavelength range from 520 to 570 nm. The color of the phosphors may be yellow, yellow green or approximately yellow green. On the other hand, the method to make the single sealant body 500 comprising phosphors 510 is not limited to the dispensing, spirit coating, CVD, or spraying. All of the above methods are included in the scope of the disclosure.

When the blue and red light emitting diode chips 410B and 410R in the single sealant body 500 respectively emit blue and red light, the phosphors 510 in the single sealant body 500 are excited by a portion of the blue lights and then generate a yellow green light. It generates a high color rendering index white light with the color temperature between 10000K and 2500K by mixing the yellow green light, the residual portion of blue lights and the red lights.

Therefore, a mixed white light is generated through distributing the blue light emitting diode chips 410B and the red light emitting diode chips 410R with the numbers in a certain ratio in an array, and also through the phosphors excited by the different wavelength lights emitted from the blue and red light emitting diode chips 410B and 410R. The foundation of the technique theory is that the luminous flux of green light is raised when the green white light is generated through the phosphors 510 excited by the blue light emitting diodes. The luminous flux and the color rendering index therefore are raised. It may be done to reduce the low efficiency situation of traditional diodes mixed light technique.

The structure of light emitting diode module 100 in the disclosure is not limited to be the surface mounted device (SMD) or the dual in-line package (DIP) element structures.

Figure 3:
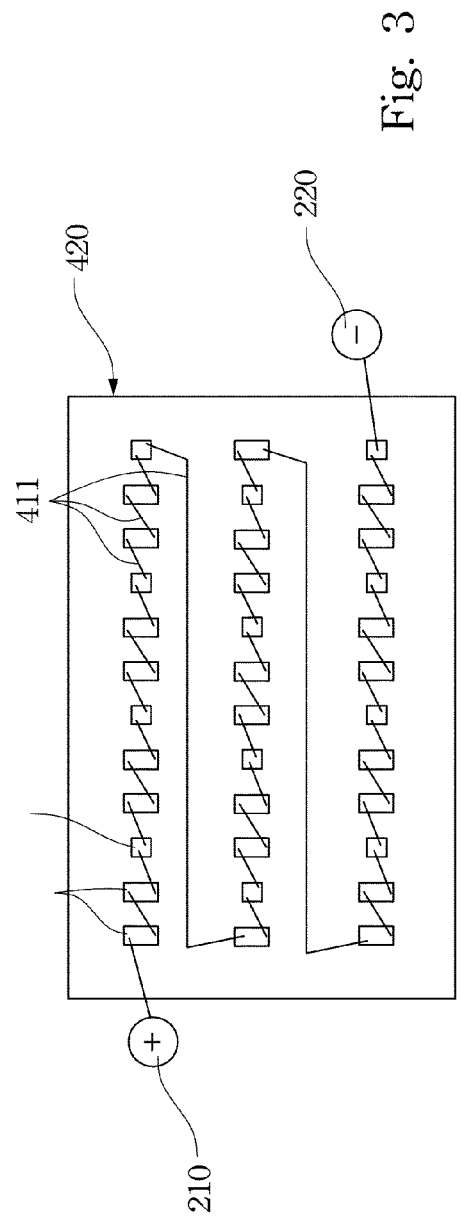
FIG. 3 is a top view of a light emitting diode module in another embodiment in the disclosure.

FIG. 3 is a top view of the light emitting diode module 100 according to another embodiment in the disclosure.

In embodiments of the disclosure, the light emitting strings 410 may be arranged nonlinearly, such as the S shape, the Z shape, or the W shape. In addition, the arrayed light emitting group 400 comprises a single light emitting string 420. No matter which shape of all the light emitting diode chips (i.e. the blue light emitting diode chips 410B and the red light emitting diode chips 410R) are arranged, there is only one light emitting diode (i.e. the blue light emitting diode chip 410B or the red light emitting diode chip 410R) electrically connected to the positive pole 210 or the negative pole 220.

Figure 4A:
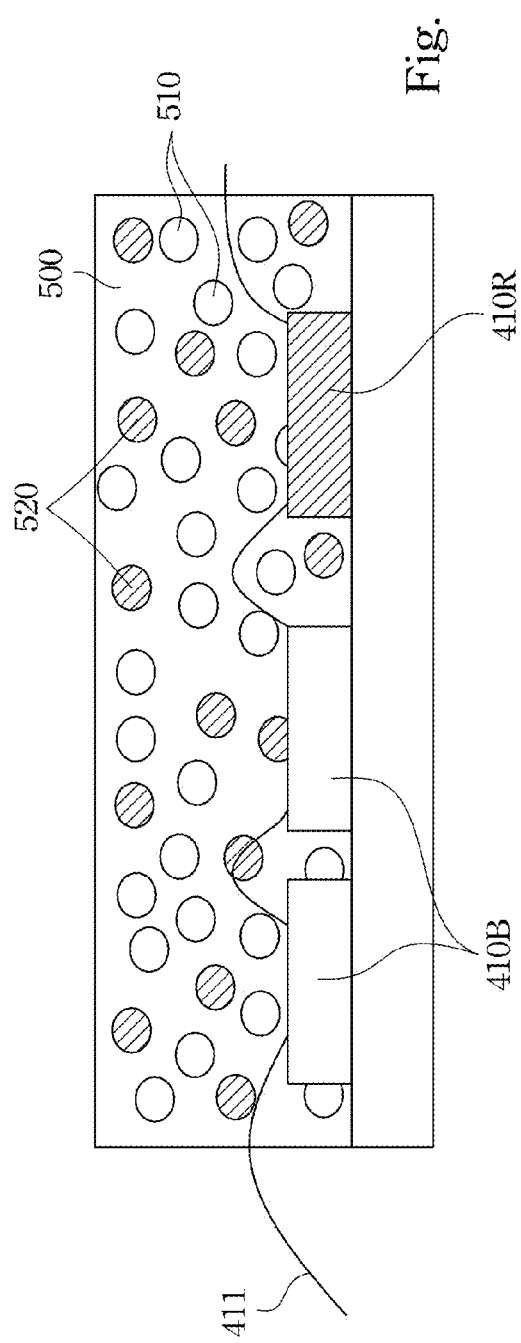
FIG. 4A is a partial side view of a light emitting diode module in another embodiment in the disclosure.

FIG. 4A is a partial side view of the light emitting diode module 100 according to another embodiment in the disclosure.

Except for the foregoing embodiment that there is only one kind of phosphors 510 with a luminescence wavelength range from 520 to 570 nm in the single sealant body 500, there are pluralities of phosphors 520 with a luminescence wavelength range from 600 to 630 nm in the single sealant body 500 in this embodiment in the disclosure. The color of the light excited by the phosphors 520 may be red or approximately red.

Therefore, not only the red light is provided from the red light emitting diode chips 410R, but also another red excitation lights are provided by the single sealant body 500. These red lights may slightly modify the x or y values of the mixed white light in chromaticity chart.

Figure 4B:
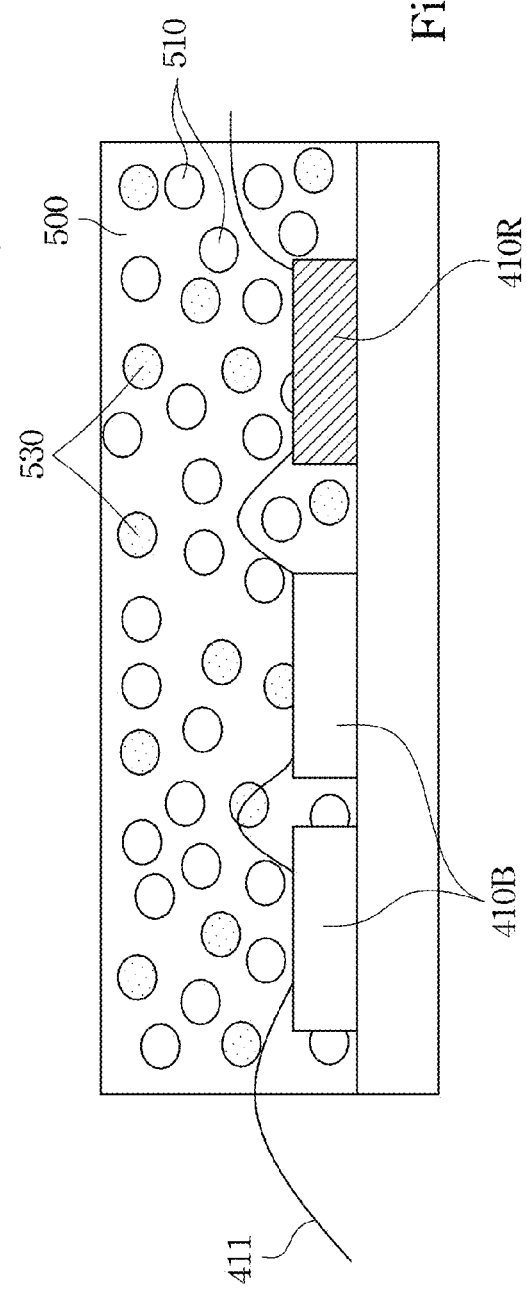
FIG. 4B is a partial side view of a light emitting diode module in the other one embodiment in the disclosure.

FIG. 4B is a partial side view of the light emitting diode module 100 according to the other embodiment in the disclosure.

Except for the foregoing embodiment that there is only one kind of phosphors 510 with a luminescence wavelength range from 520 to 570 nm in the single sealant body 500, there are pluralities of phosphors 530 with a luminescence wavelength range from 585 to 630 nm in the single sealant body 500 in this embodiment. The color of the light excited by the phosphors 530 may be amber, red yellow, red orange or approximately red orange.

Therefore, the extra-excited lights may be provided within the single sealant body 500 so as to slightly modify the x or y values of the mixed white light in color temperature chart.

Figure 5:
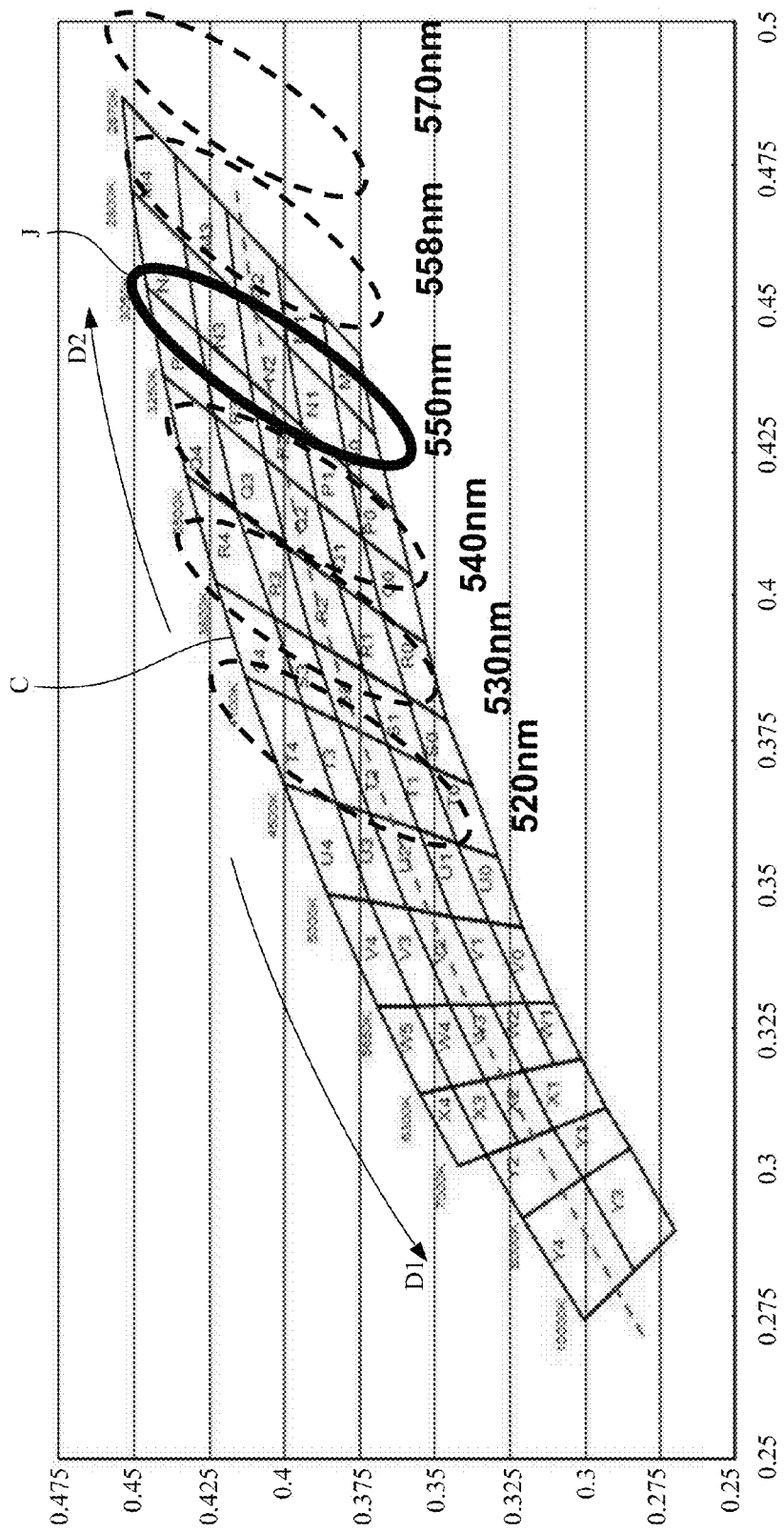
FIG. 5 to FIG. 14 are color gamut space diagrams of the light emitting diode module in FIG. 1 according to the embodiment in the disclosure.

FIG. 5 is a color gamut space diagram of the light emitting diode module 100 in FIG. 1 according to the embodiment in the disclosure.

The lights of the light emitting diodes usually are able to be divided to a plurality of chromaticity sections in the chromaticity chart. In general, the chromaticity section C in the center position, for example, Cx is about 0.35 to 0.4 and Cy is about 0.35 to 0.4, represents an average chromaticity range, whose luminescent chromaticity is a substantially neutral white light. The chromaticity sections from the central section C to the high temperature sections, D1 for example, are belonged to the chromaticity with cool colors. The luminescent chromaticity changes from the neutral white light to the white blue (cool) light, for example, Cx is about 0.275 to 0.35 and Cy is about 0.275 to 0.35. In contrast, the chromaticity sections from the central section C to the low temperature sections, D2 for example, are belonged to the chromaticity with warm colors. The luminescent chromaticity changes from the neutral white light to the white red (warm) light, Cx is about 0.4 to 0.475 and Cy is about 0.375 to 0.425 for example.

The ratio of the number of red light emitting diode chips 410R to the number of blue light emitting diode chips 410B in each of the light emitting strings 410 is 1:2 in this embodiment. In other words, it is arranged with one time number of the red light emitting diode chips 410R and two times number of the blue light emitting diode chips 410B.

The color temperature range of the mixed white light is between 2670K and 4100K since the luminescence wavelength range of the phosphors 510 is from 520 to 570 nm.

The color temperature range of the mixed white light is between 3000K and 2800K (the chromaticity section J) when the luminescence wavelength range of the phosphors 510 is 550 nm.

In addition, the ratio of the number of red light emitting diode chips 410R to the number of blue light emitting diode chips 410B in each one of the light emitting strings 410 remains the same in this embodiment.

Furthermore, the blue light emitting diode chips 410B and the red light emitting diode chips 410R are separated in a certain equidistant distance from each other in this embodiment.

Figure 6:
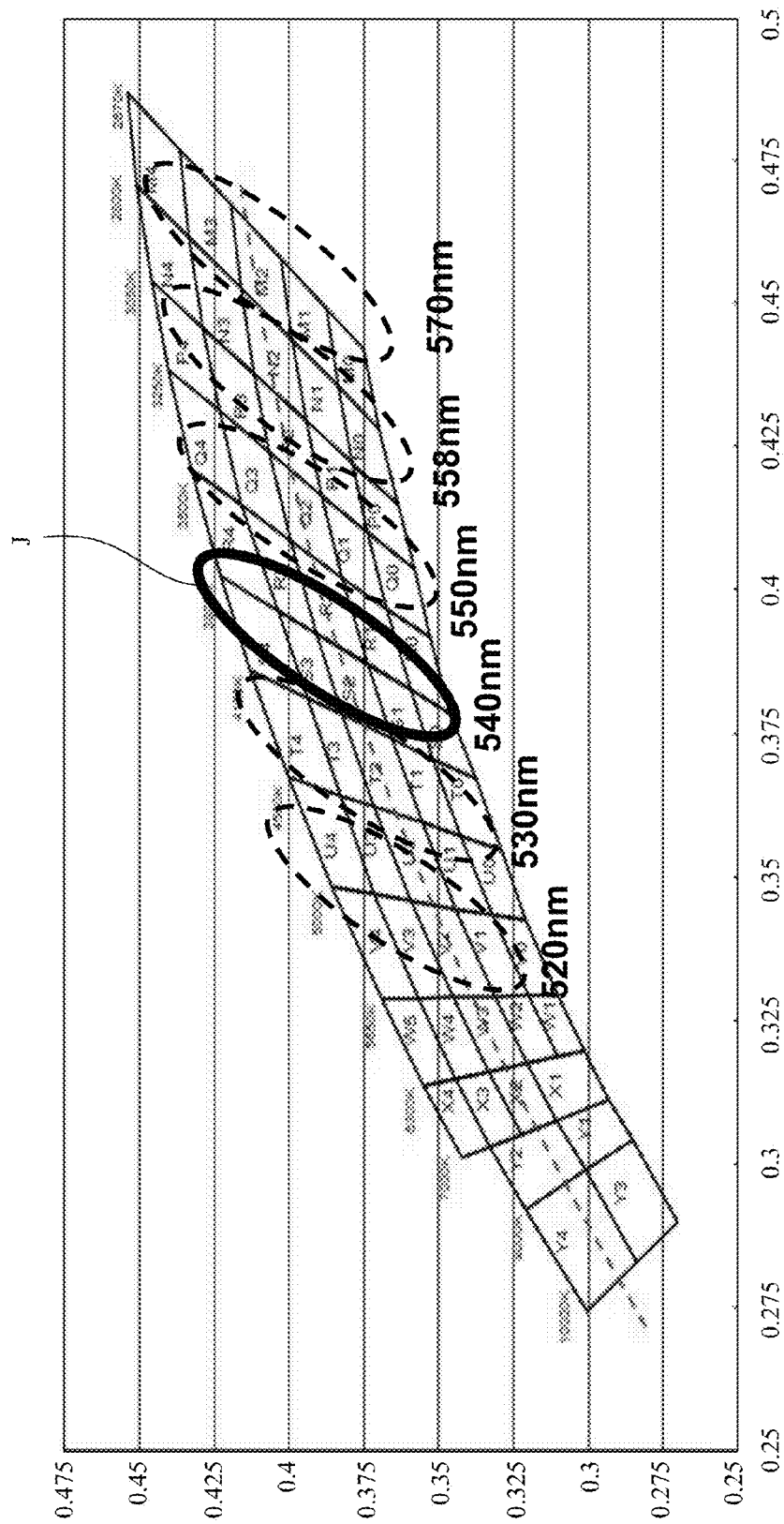

FIG. 6 is a color gamut space diagram of the light emitting diode module 100 in FIG. 1 according to the embodiment in the disclosure.

The ratio of the number of red light emitting diode chips 410R to the number of blue light emitting diode chips 410B in each one of the light emitting strings 410 is 1:3 in this embodiment. In other words, it is arranged with one time number of the red light emitting diode chips 410R and three times number of the blue light emitting diode chips 410B.

The color temperature range of the mixed white light is between 2670K and 4500K since the luminescence wavelength of the phosphors 510 range from 520 to 570 nm. The color temperature range of the mixed white light is between 4100K and 3500K (the chromaticity section J) when the luminescence wavelength range of the phosphors 510 is 540 nm. In addition, the ratio of the number of red light emitting diode chips 410R to the number of blue light emitting diode chips 410B in each one of the light emitting strings 410 remains the same in this embodiment.

Furthermore, the blue light emitting diode chips 410B and the red light emitting diode chips 410R are separated in a certain equidistant distance from each other in this embodiment.

Figure 7:
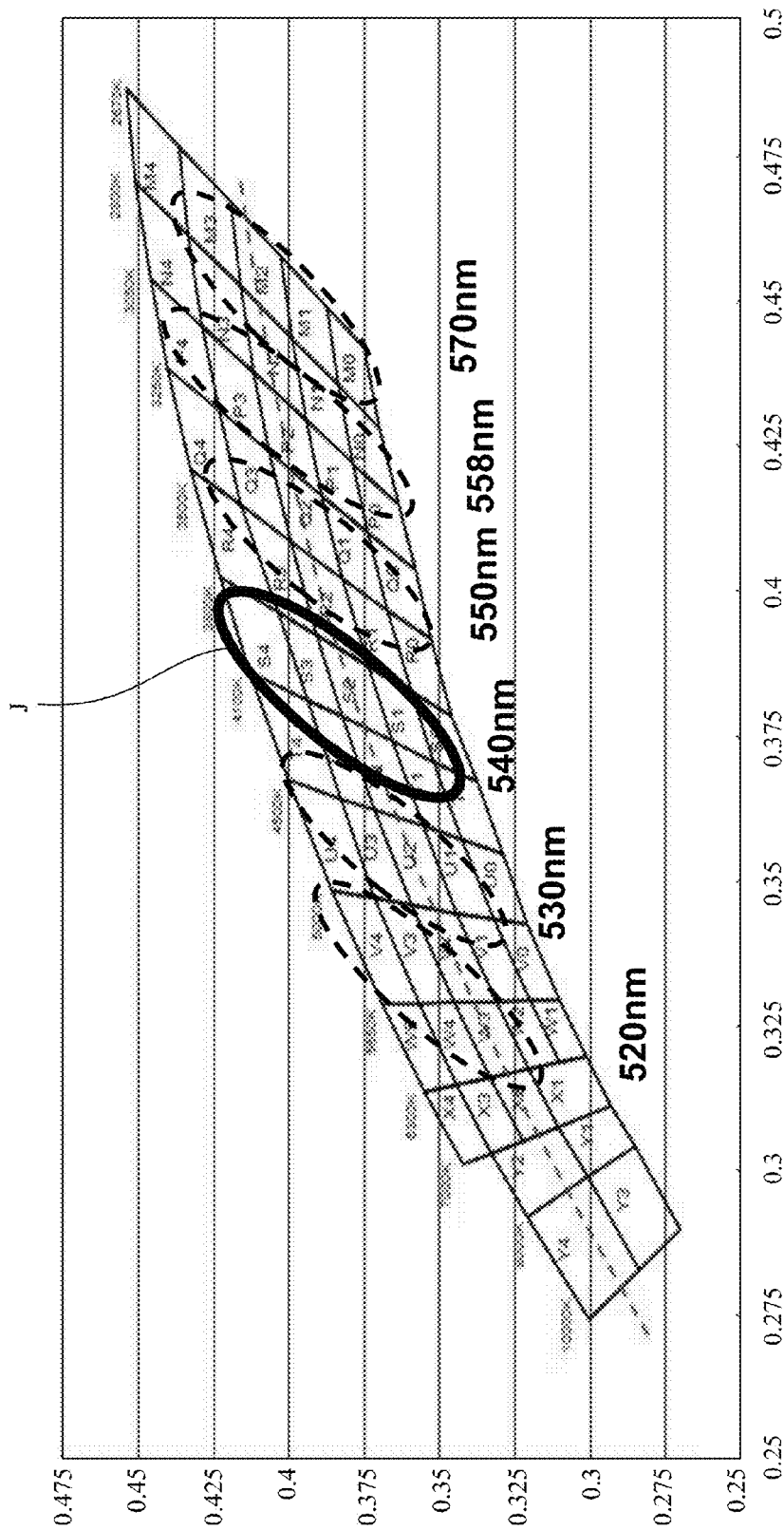

FIG. 7 is a color gamut space diagram of the light emitting diode module 100 in FIG. 1 according to the embodiment in the disclosure.

The ratio of the number of red light emitting diode chips 410R to the number of blue light emitting diode chips 410B in each one of the light emitting strings 410 is 1:4 in this embodiment. In other words, it is arranged with one time number of the red light emitting diode chips 410R and four times number of the blue light emitting diode chips 410B.

The color temperature range of the mixed white light is between 2670K and 6300K since the luminescence wavelength range of the phosphors 510 is from 520 to 570 nm.

The color temperature range of the mixed white light is between 4300K and 3800K (the chromaticity section J) when the luminescence wavelength range of the phosphors 510 is 540 nm. In addition, the ratio of the number of red light emitting diode chips 410R to the number of blue light emitting diode chips 410B in each one of the light emitting strings 410 remains the same in this embodiment.

Furthermore, the blue light emitting diode chips 410B and the red light emitting diode chips 410R are separated in a certain equidistant distance from each other in this embodiment.

Figure 8:
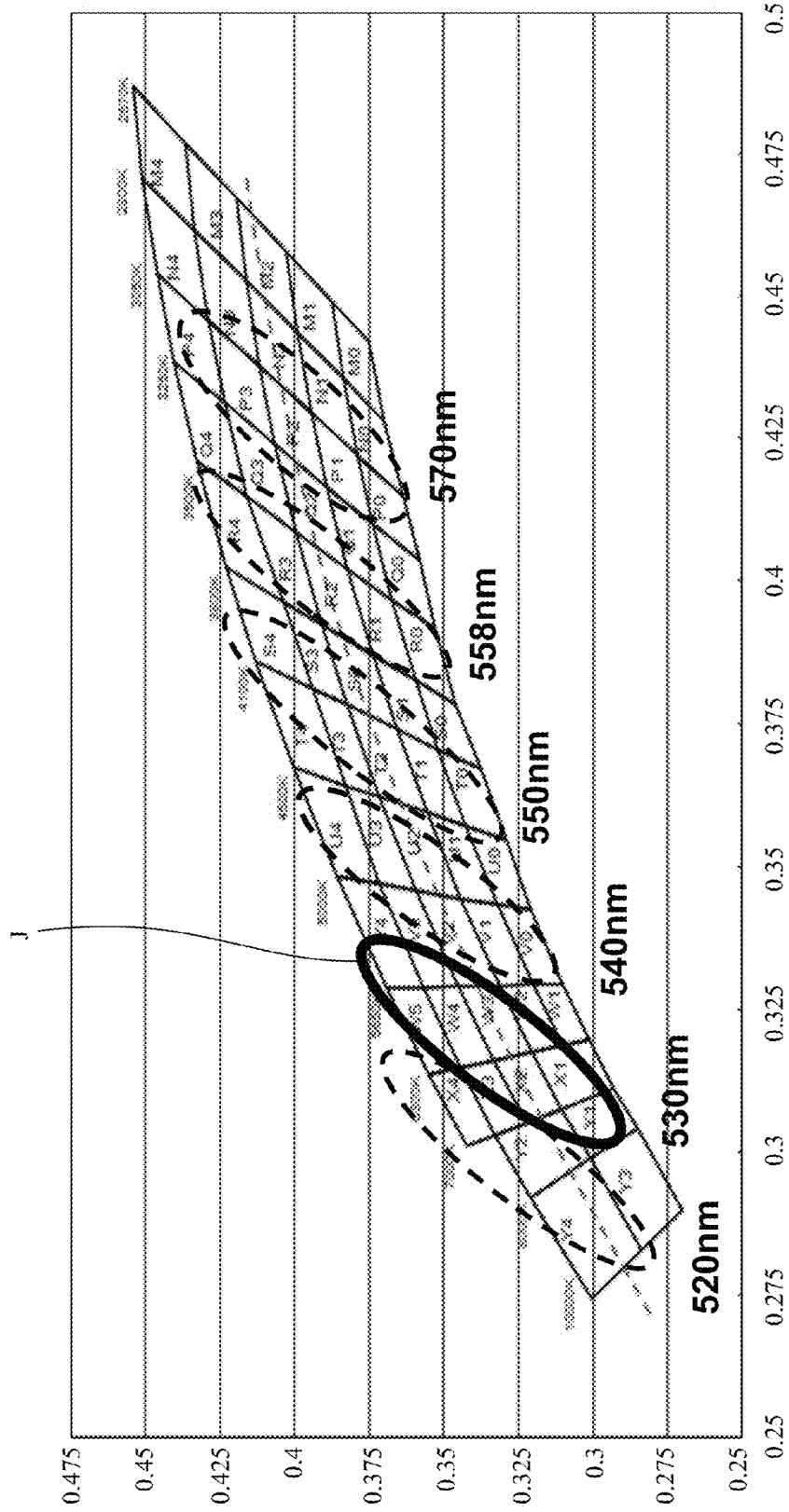

FIG. 8 is a color gamut space diagram of the light emitting diode module 100 in FIG. 1 according to the embodiment in the disclosure.

The ratio of the number of red light emitting diode chips 410R to the number of blue light emitting diode chips 410B in each one of the light emitting strings 410 is 1:5 in this embodiment. In other words, it is arranged with one time number of the red light emitting diode chips 410R and five times number of the blue light emitting diode chips 410B.

The color temperature range of the mixed white light is between 2800K and 10000K since the luminescence wavelength of the phosphors 510 range from 520 to 570 nm.

The color temperature range of the mixed white light is between 5000K and 8000K (the chromaticity section J) when the luminescence wavelength range of the phosphors 510 is 540 nm. In addition, the ratio of the number of red light emitting diode chips 410R to the number of blue light emitting diode chips 410B in each one of the light emitting strings 410 remains the same in this embodiment.

Furthermore, the blue light emitting diode chips 410B and the red light emitting diode chips 410R are separated in a certain equidistant distance from each other in this embodiment.

Figure 9:
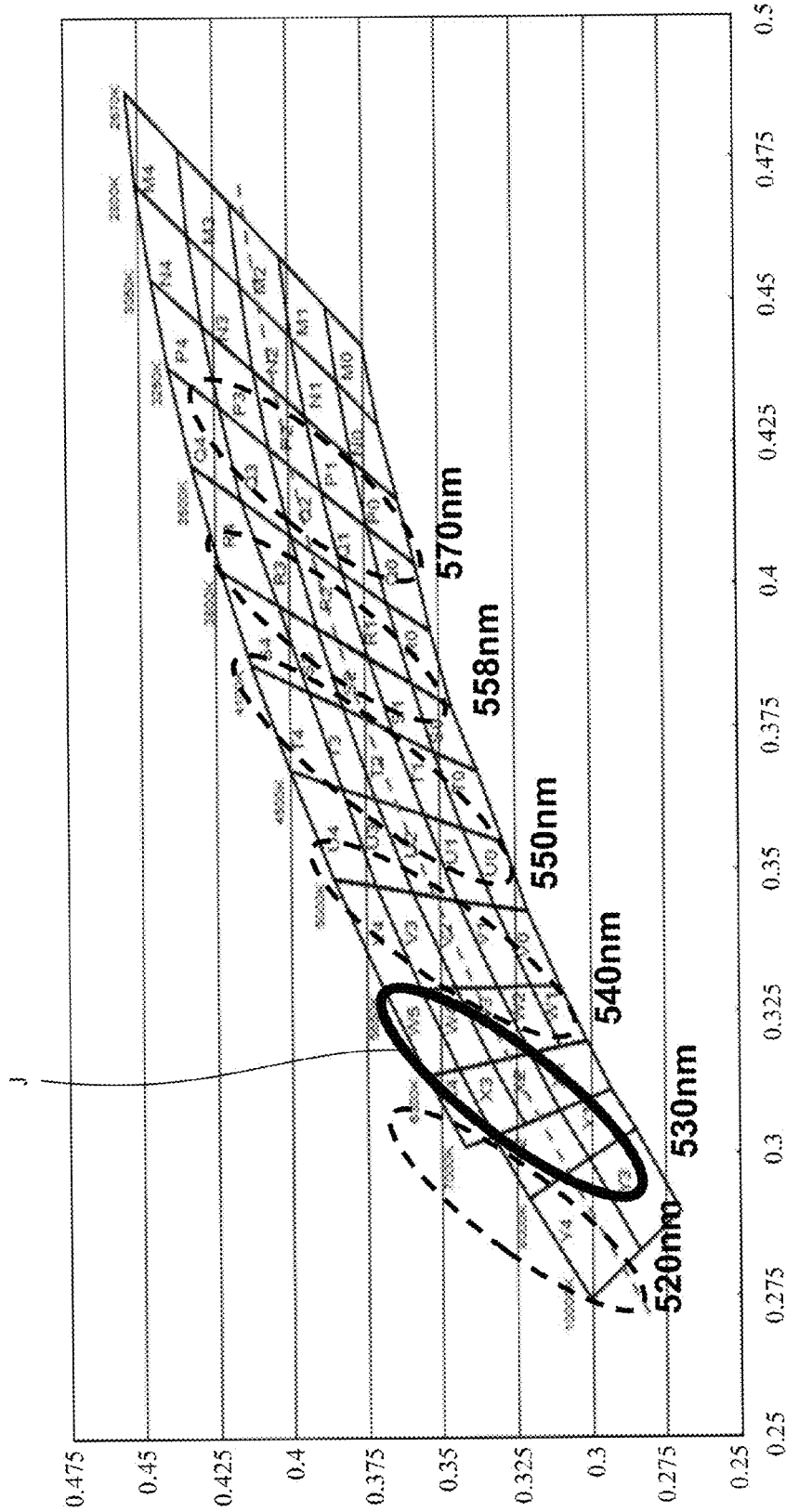
Figure 10:
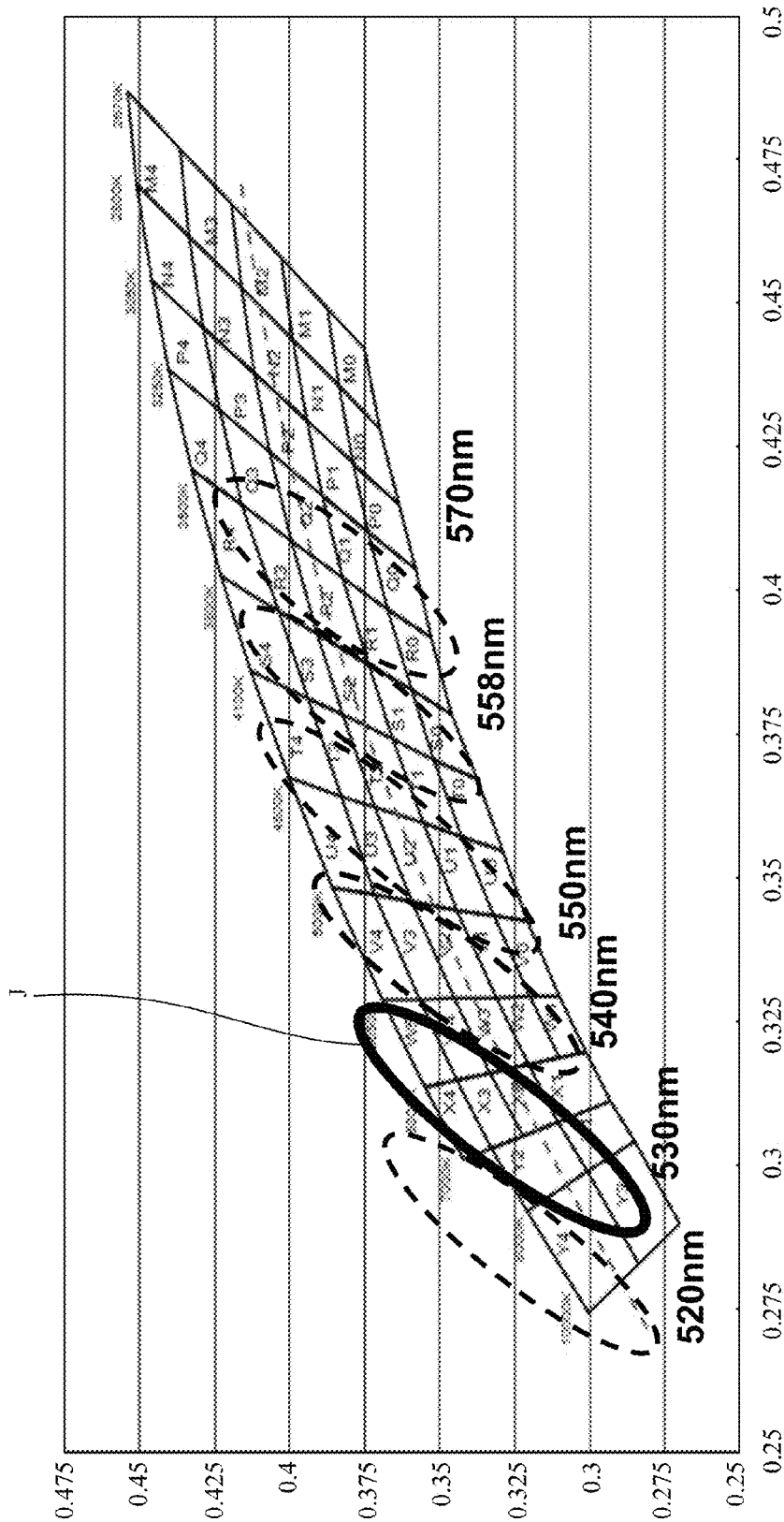

FIG. 9 and FIG. 10 are two color gamut space diagrams of the light emitting diode module 100 in FIG. 1 according to the embodiment in the disclosure.

The ratio of the number of red light emitting diode chips 410R to the number of blue light emitting diode chips 410B in each one of the light emitting strings 410 is 1:6 or 1:7 in this embodiment. In other words, it is arranged with one time number of the red light emitting diode chips 410R and six or seven times number of the blue light emitting diode chips 410B.

The color temperature range of the mixed white light is between 3050K and 10000K since the luminescence wavelength of the phosphors 510 range from 520 to 570 nm.

The color temperature range of the mixed white light is between 5650K and 10000K (the chromaticity section J) when the luminescence wavelength range of the phosphors 510 is 530 nm. In addition, the ratio of the number of red light emitting diode chips 410R to the number of blue light emitting diode chips 410B in each one of the light emitting strings 410 remains the same in this embodiment.

Furthermore, the blue light emitting diode chips 410B and the red light emitting diode chips 410R are separated in a certain equidistant distance from each other in this embodiment.

Figure 11:
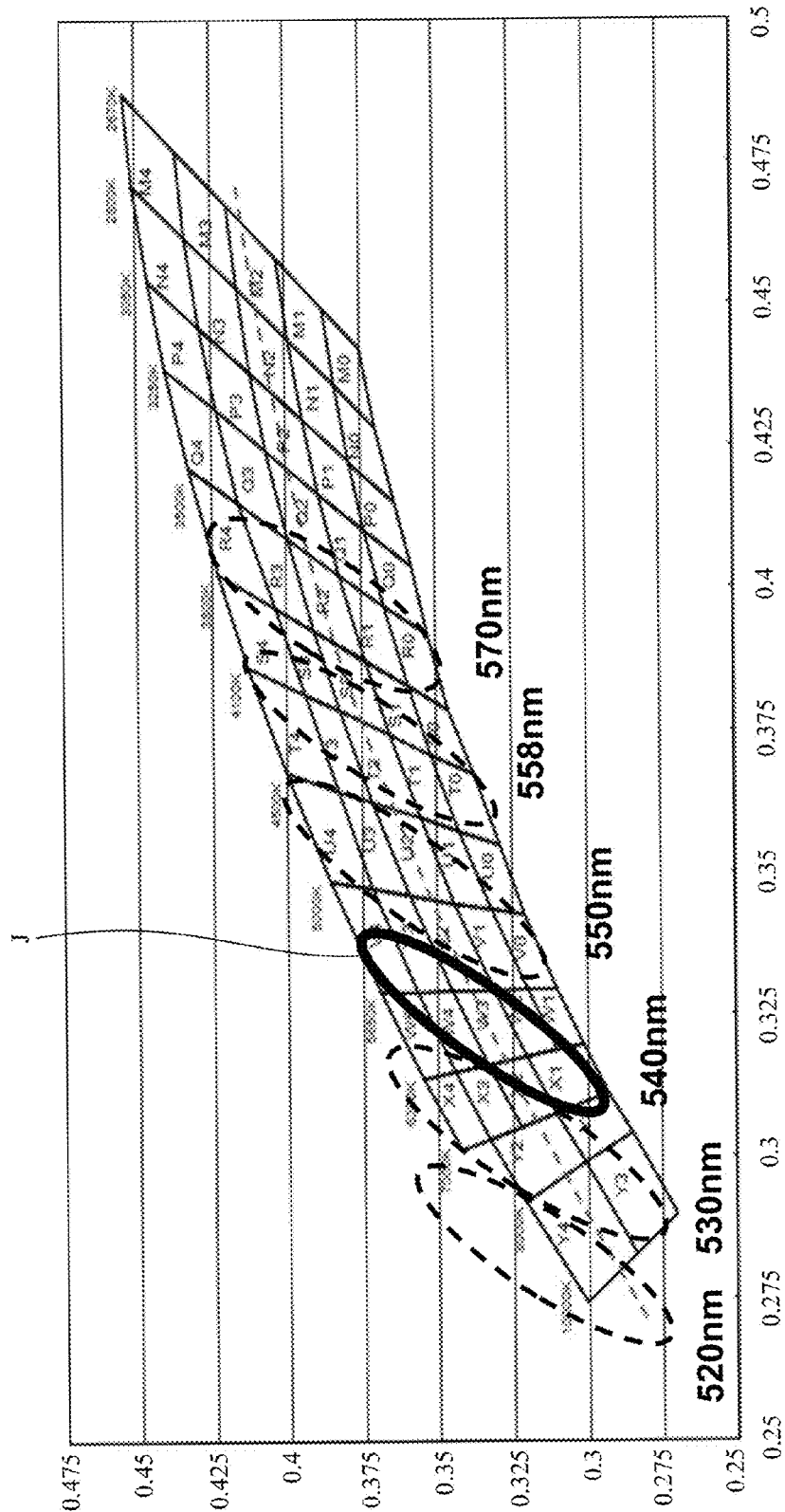
Figure 12:
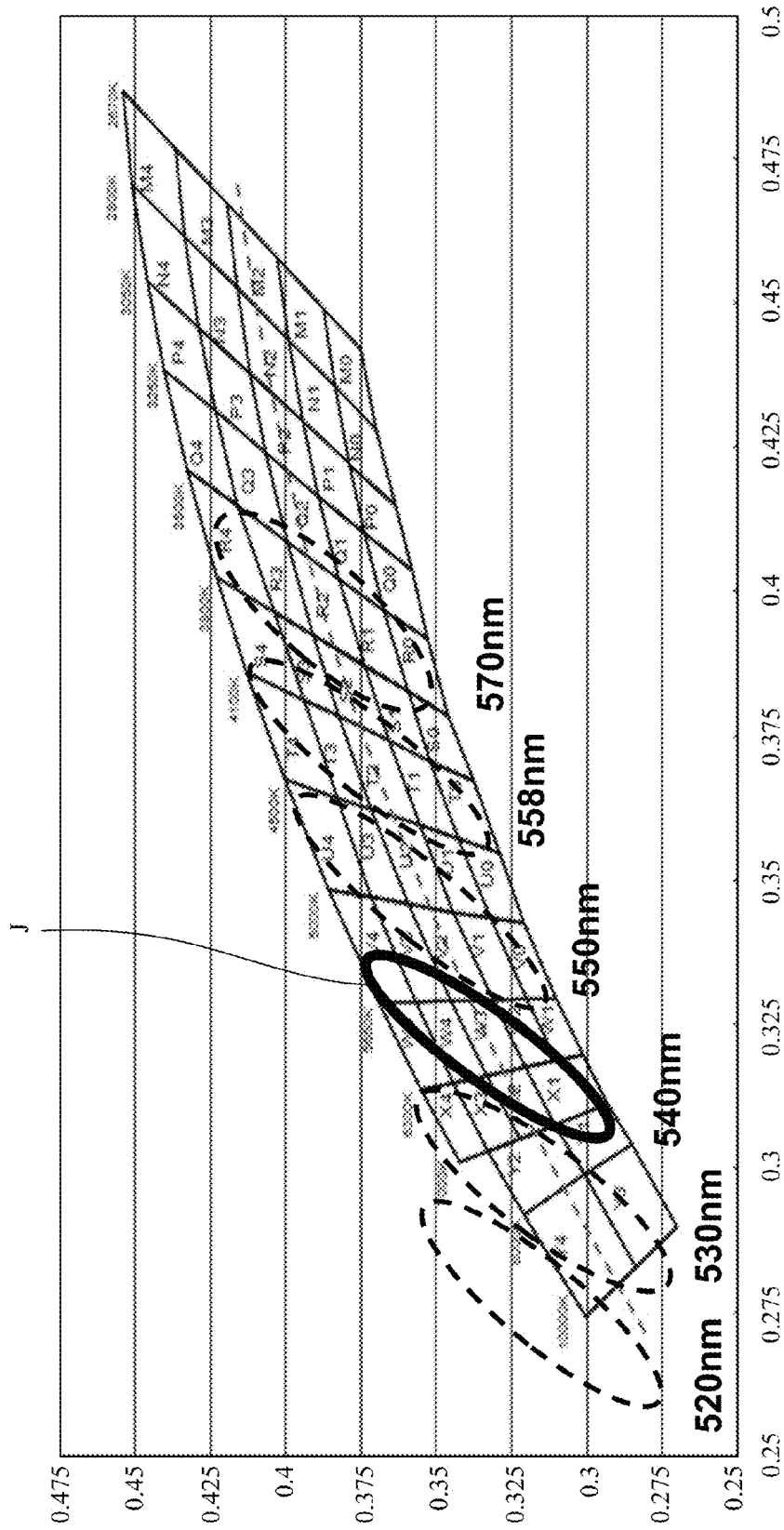

FIG. 11 and FIG. 12 are two color gamut space diagrams of the light emitting diode module 100 in FIG. 1 according to the embodiment in the disclosure.

The ratio of the number of red light emitting diode chips 410R to the number of blue light emitting diode chips 410B in each one of the light emitting strings 410 is 1:8 or 1:9 in this embodiment. In other words, it is arranged with one time number of the red light emitting diode chips 410R and eight or nine times number of the blue light emitting diode chips 410B.

The color temperature range of the mixed white light is between 3500K and 10000K since the luminescence wavelength range of the phosphors 510 is from 520 to 570 nm.

The color temperature range of the mixed white light is between 5000K and 7000K (the chromaticity section J) when the luminescence wavelength range of the phosphors 510 is 540 nm. In addition, the ratio of the number of red light emitting diode chips 410R to the number of blue light emitting diode chips 410B in each one of the light emitting strings 410 remains the same in this embodiment.

Furthermore, the blue light emitting diode chips 410B and the red light emitting diode chips 410R are separated in a certain equidistant distance from each other in this embodiment.

Figure 13:
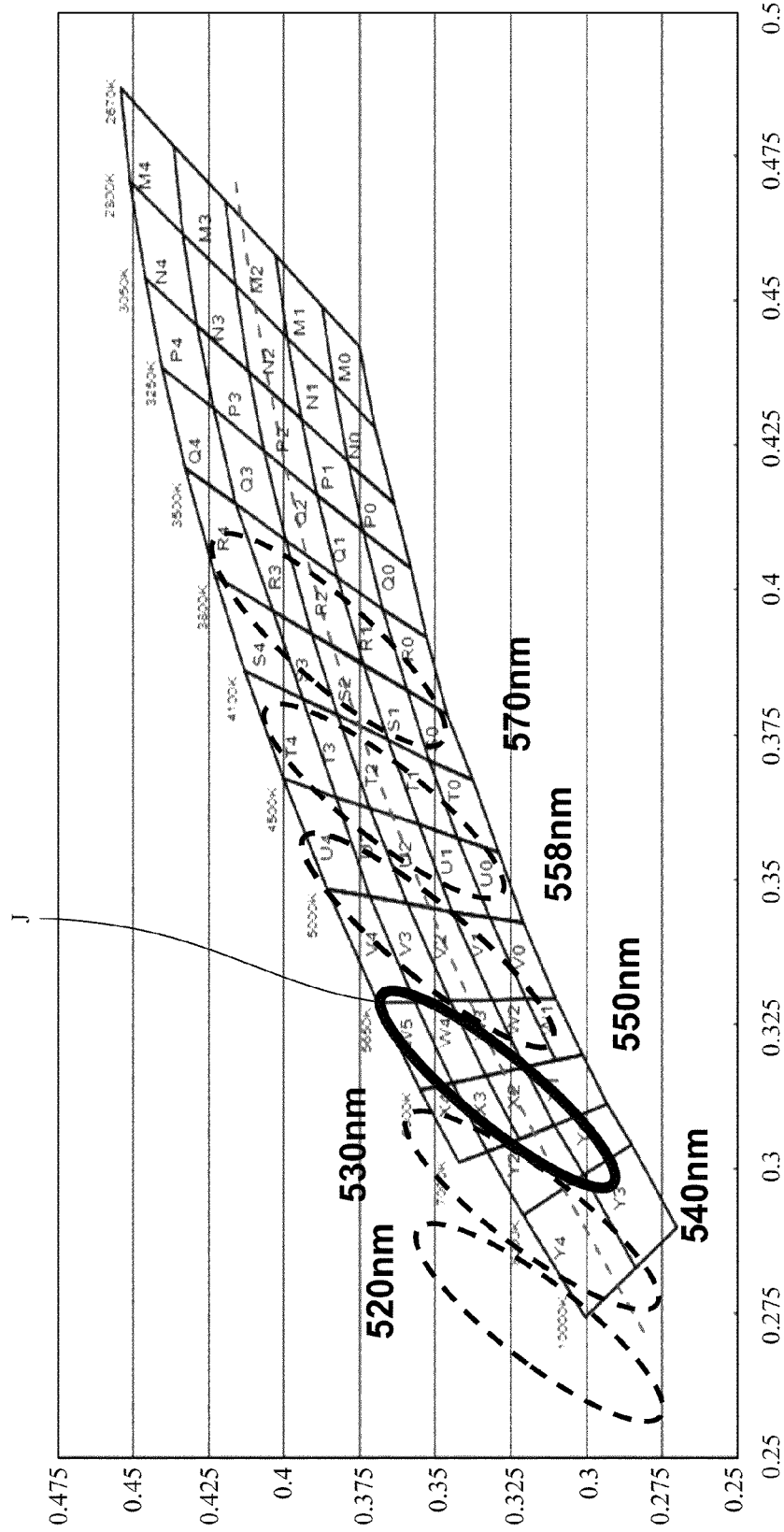

FIG. 13 is a color gamut space diagram of the light emitting diode module 100 in FIG. 1 according to the embodiment in the disclosure.

The ratio of the number of red light emitting diode chips 410R to the number of blue light emitting diode chips 410B in each one of the light emitting strings 410 is 1:10 in this embodiment. In other words, it is arranged with one time number of the red light emitting diode chips 410R and ten times number of the blue light emitting diode chips 410B.

The color temperature range of the mixed white light is between 3500K and 10000K since the luminescence wavelength range of the phosphors 510 is from 520 to 570 nm.

The color temperature range of the mixed white light is between 5650K and 8000K (the chromaticity section J) when the luminescence wavelength range of the phosphors 510 is 540 nm. In addition, the ratio of the number of red light emitting diode chips 410R to the number of blue light emitting diode chips 410B in each one of the light emitting strings 410 remains the same in this embodiment.

Furthermore, the blue light emitting diode chips 410B and the red light emitting diode chips 410R are separated in a certain equidistant distance from each other in this embodiment.

Figure 14:
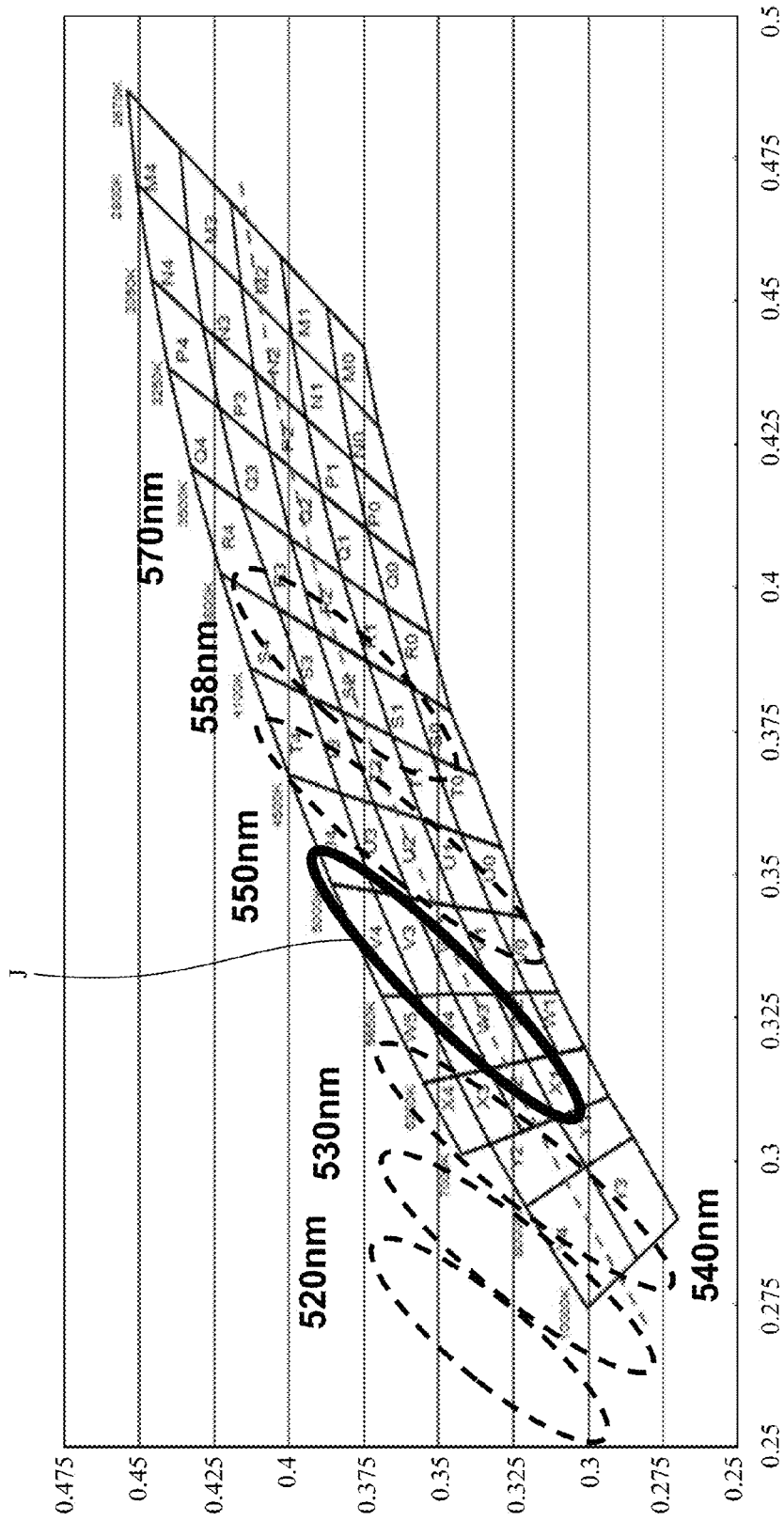

FIG. 14 is a color gamut space diagram of the light emitting diode module 100 in FIG. 1 according to the embodiment in the disclosure.

The ratio of the number of red light emitting diode chips 410R to the number of blue light emitting diode chips 410B in each one of the light emitting strings 410 is 1:11 in this embodiment. In other words, it is arranged with one time number of the red light emitting diode chips 410R and eleven times number of the blue light emitting diode chips 410B.

The color temperature range of the mixed white light is between 3500K and 10000K since the luminescence wavelength range of the phosphors 510 is from 520 to 570 nm.

It is better that the color temperature range of the mixed white light is between 5000K and 6300K (the chromaticity section J) while the luminescence wavelength of the phosphors 510 is 550 nm. In addition, the ratio of the number of red light emitting diode chips 410R to the number of blue light emitting diode chips 410B in each one of the light emitting strings 410 remains the same in this embodiment.

Furthermore, the blue light emitting diode chips 410B and the red light emitting diode chips 410R are separated in a certain equidistant distance from each other in this embodiment.

Figure 15:
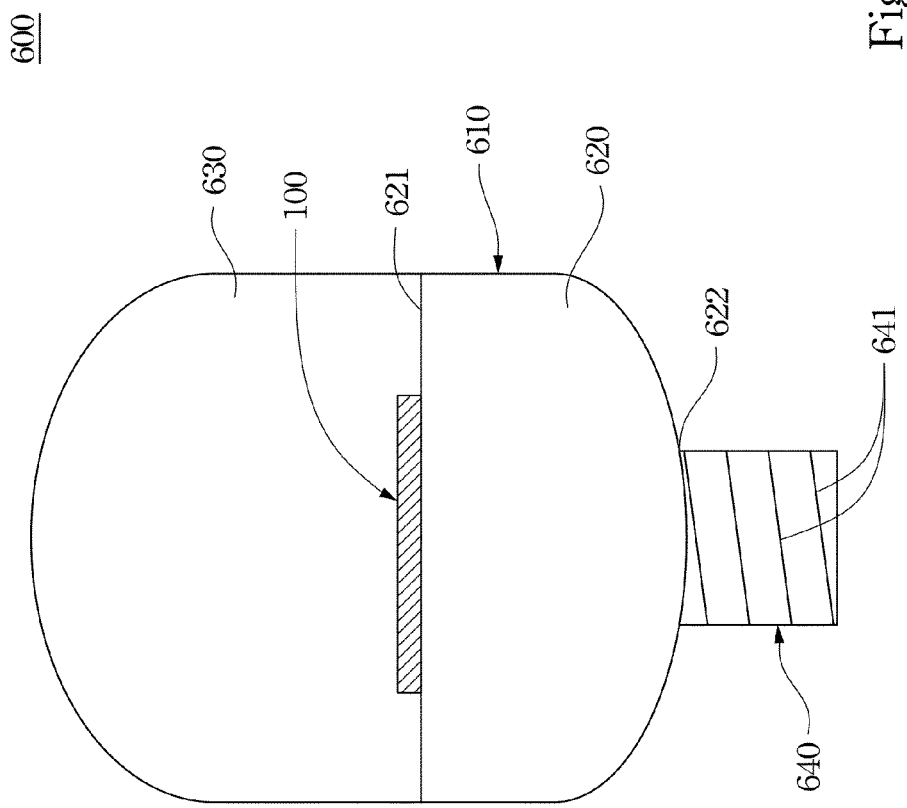
FIG. 15 is a schematic diagram of a light device according to one embodiment in the disclosure.

FIG. 15 is a schematic diagram of the light device 600 in one embodiment in the disclosure.

The light emitting diode module 100 may further be applied to a light device 600 for providing a white light source with high efficiency and high color rendering index. The light device 600 includes a base 610, a lamp cover 630, and the light emitting diode module 100 mentioned above. The base 610 comprises a main body 620 and a cylindrical lamp socket 640. The main body 620 comprises a top surface 621 and a bottom surface 622 facing each other. The top surface 621 is an accommodating surface for setting the light emitting diode module 100. The light cover 630 is disposed on the top surface 621 and covers the top surface 621 and the light emitting diode module 100 simultaneously. The cylindrical lamp socket 640 connected to the bottom face 622 comprises a screw base 641 fitted with a light device mother base, which is not shown in the figure. Therefore, the cylindrical lamp socket 640 is able to be combined to the light device mother base.

The electricity of positive pole 210 and the negative pole 220 in the light emitting diode module 100 are switched on when the light device mother base provides a power source to the light emitting diode module 100. The light emitting string 410 in the light emitting diode module 100 is then driven so that the red light emitting diode chips 410R and the blue light emitting diode chips 410B with corresponding numbers emit lights toward the single sealant body to mix the lights uniformly.

The variable examples such that the base 610 is not limited to be plastic or metal materials, which may be a media that transfers the heat the light emitting diode 100 generated away the light emitting diode 100. The shape of the light device 600 in the figure mentioned above is only an example, and it is not a limitation in the disclosure.

Given the above, the embodiments of the disclosure provide solutions of the non-uniform mixed light situations in the light emitting diodes in the art. The luminous flux extracted in unit area can be maximized by using the light device and the light emitting diode module in the embodiments in the disclosure. In addition, the light emitting diode module with high efficiency and high CRI can be achieved by using the combination of the specific phosphors and the light emitting diodes with certain luminescence flux ratios accordingly. In addition, since the single sealant body in the embodiments of the disclosure is configured to cover all the light emitting strings, it not only simplifies the fabrication processes and reduces the cost, but also increases the fabrication yield rate because the high temperature fabrication processes are unnecessary. Moreover, the single light emitting diode module according to the embodiments of the disclosure can effectively increase the luminescence efficiency, concentrate the output of the emitting light, and enhance the uniform mixed light effect of light emitting strings and the phosphors at the same time. High degree of freedom is provided in designing the single light emitting diode module since the x and y values of the chromaticity chart of the single light emitting diode is able to be changed by adjusting the concentration of the phosphors. On the other hand, the arrangement of the single light emitting diode module in the embodiments of the disclosure is more flexible since the locations of the chips in the single light emitting diode module may be arranged freely before sealing, in contrast to the prior art with more limitations such as the arranged positions of the diodes may not be considered until they are sealed individually.

Although the embodiments of the present disclosure have been described in considerable details with reference certain embodiments thereof, other embodiments are possible. Therefore, their spirit and scope of the appended claims should be not limited to the description of the embodiments herein.

It will be apparent to those ordinarily skilled in the art that various modifications and variations can be made to the structure of the present disclosure without departing from the scope or spirit of the disclosure. In view of the foregoing, it is intended that the embodiments of the present disclosure cover modifications and variations of the disclosure provided they fall within the scope of the following claims.

What is claimed is:

1. A light emitting diode module, comprising:
a substrate, comprising a positive pole and a negative pole;
an arrayed light emitting group, comprising a plurality of light emitting strings electrically coupled to the positive pole and the negative pole in parallel, each one of the light emitting strings comprising:
N number of blue light emitting diode chips for emitting a blue light with a luminescence wavelength range from 445 to 460 nm; and
M number of red light emitting diode chips for emitting a red light with a luminescence wavelength range from 600 to 630 nm, the red light emitting diode chips and the blue light emitting diode chips disposed on the substrate in series, the red light emitting diode chips in an interlaced arrangement between the blue light emitting diode chips, wherein N number and M number are positive integers, and M>N≥1; and
a single sealant body for covering all of the light emitting strings, and being uniformly dispersed with a plurality of phosphors with a luminescence wavelength range from 520 to 570 nm,
wherein the phosphors in the single sealant body are excited by a part of the blue light and then generate a yellow green light, and a white light with a color temperature range between 10000K to 2500K is mixed by the yellow green light, the red light and the other part of the blue light.

2. The light emitting diode module of claim 1, wherein a ratio of the red light emitting diode chips and the blue light emitting diode chips in each one of the light emitting strings is from 1:2 to 1:11.

3. The light emitting diode module of claim 2, wherein the ratio of the number of red light emitting diode chips to the number of blue light emitting diode chips in each of the light emitting strings is 1:2, and the color temperature range of the white light is from 3000K to 2800K when the luminescence wavelength range of the phosphors is 550 nm.

4. The light emitting diode module of claim 2, wherein the ratio of the number of red light emitting diode chips to the number of blue light emitting diode chips in each of the light emitting strings is 1:3, and the color temperature range of the white light is from 4100K to 3500K when the luminescence wavelength range of the phosphors is 540 nm.

5. The light emitting diode module of claim 2, wherein the ratio of the number of red light emitting diode chips to the number of blue light emitting diode chips in each of the light emitting strings is 1:4, and the color temperature range of the white light is from 4300K to 3800K when the luminescence wavelength range of the phosphors is 540 nm.

6. The light emitting diode module of claim 2, wherein the ratio of the number of red light emitting diode chips to the number of blue light emitting diode chips in each of the light emitting strings is 1:5, and the color temperature range of the white light is from 5000K to 8000K when the luminescence wavelength range of the phosphors is 530 nm.

7. The light emitting diode module of claim 2, wherein the ratio of the number of red light emitting diode chips to the number of blue light emitting diode chips in each of the light emitting strings is 1:6 or 1:7, and the color temperature range of the white light is from 5650K to 10000K when the luminescence wavelength range of the phosphors is 530 nm.

8. The light emitting diode module of claim 2, wherein the ratio of the number of red light emitting diode chips to the number of blue light emitting diode chips in each of the light emitting strings is 1:8 or 1:9, and the color temperature range of the white light is from 5000K to 7000K when the luminescence wavelength range of the phosphors is 540 nm.

9. The light emitting diode module of claim 2, wherein the ratio of the number of red light emitting diode chips to the number of blue light emitting diode chips in each of the light emitting strings is 1:10, and the color temperature range of the white light is from 5650K to 8000K when the luminescence wavelength range of the phosphors is 540 nm.

10. The light emitting diode module of claim 2, wherein the ratio of the number of red light emitting diode chips to the number of blue light emitting diode chips in each of the light emitting strings is 1:11, and the color temperature range of the white light is from 5000K to 6300K when the luminescence wavelength range of the phosphors is 550 nm.

11. The light emitting diode module of claim 2, wherein one of the light emitting strings is arranged linearly or non-linearly.

12. The light emitting diode module of claim 1, wherein a ratio of the number of red light emitting diode chips to the number of blue light emitting diode chips in each one of the light emitting strings remains the same.

13. The light emitting diode module of claim 1, further comprising a plurality of phosphors with luminescence wavelength range from 600 to 630 nm dispersed in the single sealant body.

14. The light emitting diode module of claim 1, further comprising a plurality of phosphors with luminescence wavelength range from 585 to 630 nm dispersed in the single sealant body.

15. The light emitting diode module of claim 1, wherein the blue light emitting diode chips and the red light emitting diode chips are separated in a certain equidistant distance from each other.

16. A light device, comprising:
a base, comprising an accommodating surface;
the light emitting diode module of claim 1, disposed on the accommodating surface.

17. The light device of claim 16, wherein one of the light emitting strings is arranged linearly or non-linearly.

18. The light device of claim 16, wherein a ratio of the number of red light emitting diode chips to the number of blue light emitting diode chips in each one of the light emitting strings remains the same.

19. The light device of claim 16, wherein the blue light emitting diode chips and the red light emitting diode chips are separated in a certain equidistant distance from each other.

* * * * *